US008879263B2

(12) United States Patent
Gunderson

(10) Patent No.: US 8,879,263 B2
(45) Date of Patent: Nov. 4, 2014

(54) CONDUCTING HEAT AWAY FROM A PRINTED CIRCUIT BOARD ASSEMBLY IN AN ENCLOSURE

(75) Inventor: Neal Frank Gunderson, Lake Elmo, MN (US)

(73) Assignee: Seagate Technology LLC, Cupertino, CA (US)

( * ) Notice: Subject to any disclaimer, the term of this patent is extended or adjusted under 35 U.S.C. 154(b) by 356 days.

(21) Appl. No.: 13/467,621

(22) Filed: May 9, 2012

(65) Prior Publication Data

US 2012/0281364 A1  Nov. 8, 2012

Related U.S. Application Data

(63) Continuation-in-part of application No. 12/542,502, filed on Aug. 17, 2009, now Pat. No. 8,199,506.

(51) Int. Cl.
*H05K 7/20* (2006.01)
*H05K 13/00* (2006.01)
*H05K 5/02* (2006.01)

(52) U.S. Cl.
CPC .......... *H05K 5/0256* (2013.01); *H05K 7/20454* (2013.01); *H05K 5/0269* (2013.01); *H05K 7/20472* (2013.01)
USPC .......... 361/708; 361/715; 361/720; 29/592.1

(58) Field of Classification Search
CPC combination set(s) only.
See application file for complete search history.

(56) References Cited

U.S. PATENT DOCUMENTS

| | | | | |
|---|---|---|---|---|
| 4,029,999 A | * | 6/1977 | Neumann et al. | 361/704 |
| 4,768,286 A | * | 9/1988 | Ketcham | 29/841 |
| 5,061,845 A | * | 10/1991 | Pinnavaia | 235/492 |
| 5,208,733 A | * | 5/1993 | Besanger | 361/704 |
| 5,245,508 A | * | 9/1993 | Mizzi | 361/694 |
| 5,596,486 A | | 1/1997 | Young | |
| 5,661,339 A | * | 8/1997 | Clayton | 257/678 |
| 5,731,633 A | * | 3/1998 | Clayton | 257/723 |
| 6,011,690 A | | 1/2000 | Hughes | |
| 6,012,194 A | * | 1/2000 | Eshbach et al. | 15/143.1 |
| 6,035,524 A | * | 3/2000 | Suppa et al. | 29/832 |
| 6,188,576 B1 | | 2/2001 | Ali | |
| 6,252,776 B1 | | 6/2001 | Salto | |
| 6,353,538 B1 | | 3/2002 | Ali | |
| 6,465,728 B1 | | 10/2002 | McLaughlin | |
| 6,653,730 B2 | | 11/2003 | Chrysler | |
| 6,940,721 B2 | | 9/2005 | Hill | |
| 7,002,805 B2 | * | 2/2006 | Lee et al. | 361/704 |
| 7,023,699 B2 | | 4/2006 | Glovatsky | |
| 7,057,181 B2 | * | 6/2006 | Yagi | 250/370.09 |
| 7,230,831 B2 | | 6/2007 | Lockner | |

(Continued)

*Primary Examiner* — Gregory Thompson
(74) *Attorney, Agent, or Firm* — Hall Estill Attorneys at Law

(57) ABSTRACT

A printed circuit board assembly (PCBA) is connected to a frame within a passage. The PCBA includes a circuitry package attached to a printed circuit board. The circuitry package has a peripheral edge extending from the printed circuit board to a distal end joined to a cap. A cover is attached to the frame to enclose the PCBA. A thermal interface material (TIM) is disposed between the cover and the PCBA, the TIM defining an opening sized to receivingly engage the circuitry package in a close mating engagement contacting the TIM simultaneously against the cap and the peripheral edge to conduct heat away from the circuitry package. A heat conductor attached to the other side of the printed circuit board in an overlapping opposition to the circuitry package conducts heat away from the printed circuit board that is generated by the circuitry package.

22 Claims, 11 Drawing Sheets

(56) References Cited

U.S. PATENT DOCUMENTS

| | | |
|---|---|---|
| 7,347,354 B2 | 3/2008 | Hurley |
| 7,438,558 B1 | 10/2008 | Sinha |
| 7,800,065 B2 | 9/2010 | Konkle |
| 8,034,602 B2 | 10/2011 | Park |
| 2002/0105071 A1* | 8/2002 | Mahajan et al. .............. 257/720 |
| 2011/0038123 A1 | 2/2011 | Janik |

* cited by examiner

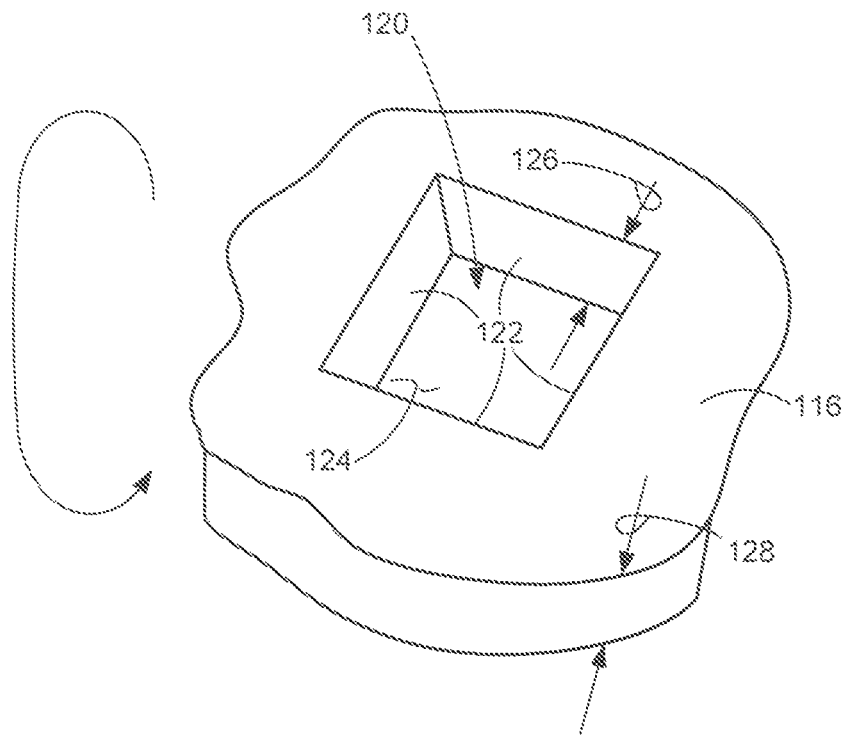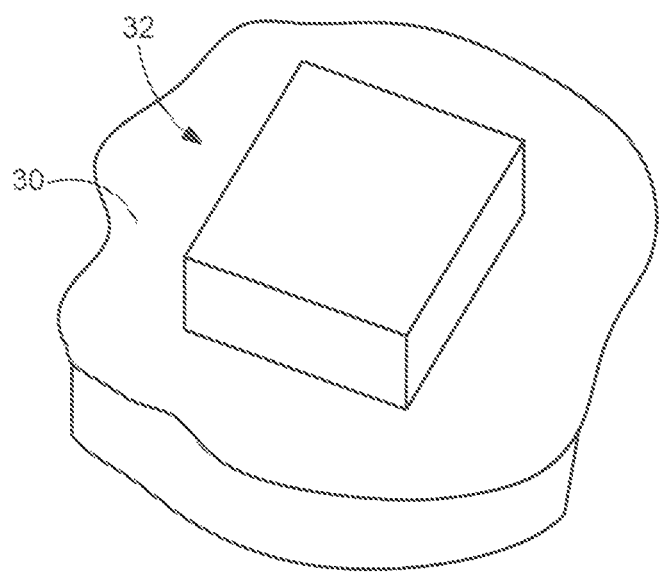
FIG. 8

CONDUCTING HEAT AWAY FROM A PRINTED CIRCUIT BOARD ASSEMBLY IN AN ENCLOSURE

RELATED APPLICATION

This is a continuation-in-part application claiming the benefit of the earlier filing date of U.S. patent application Ser. No. 12/542,502.

FIELD

The present embodiments relate generally to digital data storage, and more particularly without limitation to conducting heat away from a printed circuit board assembly in an enclosure of a data storage device.

SUMMARY

Some embodiments of the present invention contemplate an apparatus including a frame having a perimeter surface defining a passage. A printed circuit board assembly (PCBA) is operably disposed within the passage. The PCBA includes a printed circuit board and a circuitry package attached to one side of the printed circuit board. The circuitry package has a peripheral edge and a cap, the peripheral edge extending from a proximal end adjacent the printed circuit board to a distal end joined to the cap. A cover is attached to the frame to enclose the PCBA. A thermal interface material ("TIM") is operably disposed between the cover and the PCBA. The TIM defines an opening that is sized to receivingly engage the circuitry package in a close mating engagement operably contacting the TIM simultaneously against the cap and the peripheral edge to conduct heat away from the circuitry package.

Some embodiments of the present invention contemplate an apparatus including a frame having a perimeter surface defining a passage. A PCBA is operably disposed within the passage. The PCBA includes a printed circuit board and a circuitry package attached to one side of the printed circuit board. A cover is operably attached to the frame to enclose the PCBA. A TIM is operably disposed between the cover and the PCBA to conduct heat away from the circuitry package. A heat conductor is attached to the other side of the printed circuit board in an overlapping opposition to the circuitry package to conduct heat away from the printed circuit board that is generated by the circuitry package.

Some embodiments of the present invention contemplate an apparatus including a frame having a perimeter surface defining a passage. A PCBA is operably disposed within the passage. The PCBA includes a printed circuit board and a circuitry package attached to one side of the printed circuit board. The circuitry package has a peripheral edge and a cap, the peripheral edge extending from a proximal end adjacent the printed circuit board to a distal end joined to the cap. A cover is operably attached to the frame to enclose the PCBA. A TIM is operably disposed between the cover and the PCBA, the TIM defining an opening that is sized to receivingly engage the circuitry package in a close mating engagement operably contacting the TIM simultaneously against the cap and the peripheral edge to conduct heat away from the circuitry package. A heat conductor is attached to the other side of the printed circuit board in an overlapping opposition to the circuitry package to conduct heat away from the printed circuit board that is generated by the circuitry package.

Some embodiments of the present invention contemplate a method including: obtaining a frame having a perimeter surface defining a passage; obtaining a PCBA having a printed circuit board and a circuitry package attached to one side of the printed circuit board, the circuitry package having a peripheral edge and a cap, the peripheral edge extending from a proximal end adjacent the printed circuit board to a distal end joined to the cap; obtaining a TIM defining an opening that is sized to receivingly engage the circuitry package in a close mating engagement; positioning the TIM on the PCBA in the close mating engagement that contacts the TIM simultaneously against the cap and the peripheral edge; and attaching a cover to the frame to enclose the PCBA.

BRIEF DESCRIPTION OF THE DRAWINGS

FIG. 8 is a partially exploded isometric depiction of a portion of the data storage assembly of FIG. 5.

DETAILED DESCRIPTION

Initially, it is to be appreciated that this disclosure is by way of example only, not by limitation. The heat transfer concepts herein are not limited to use or application with any specific system or method for using storage element devices. Thus, although the instrumentalities described herein are for the convenience of explanation, shown and described with respect to exemplary embodiments, it will be appreciated that the principles herein may be applied equally in other types of storage element systems and methods involving the storage and retrieval of data.

Solid state data storage is an advancing technology for data storage applications. Solid state data storage devices differ from non-solid state devices in that they typically have no moving parts and include memory chips to store data. Examples of solid state memory components used for solid state data storage include flash memory and magnetic random access memory (MRAM).

Figure 1:
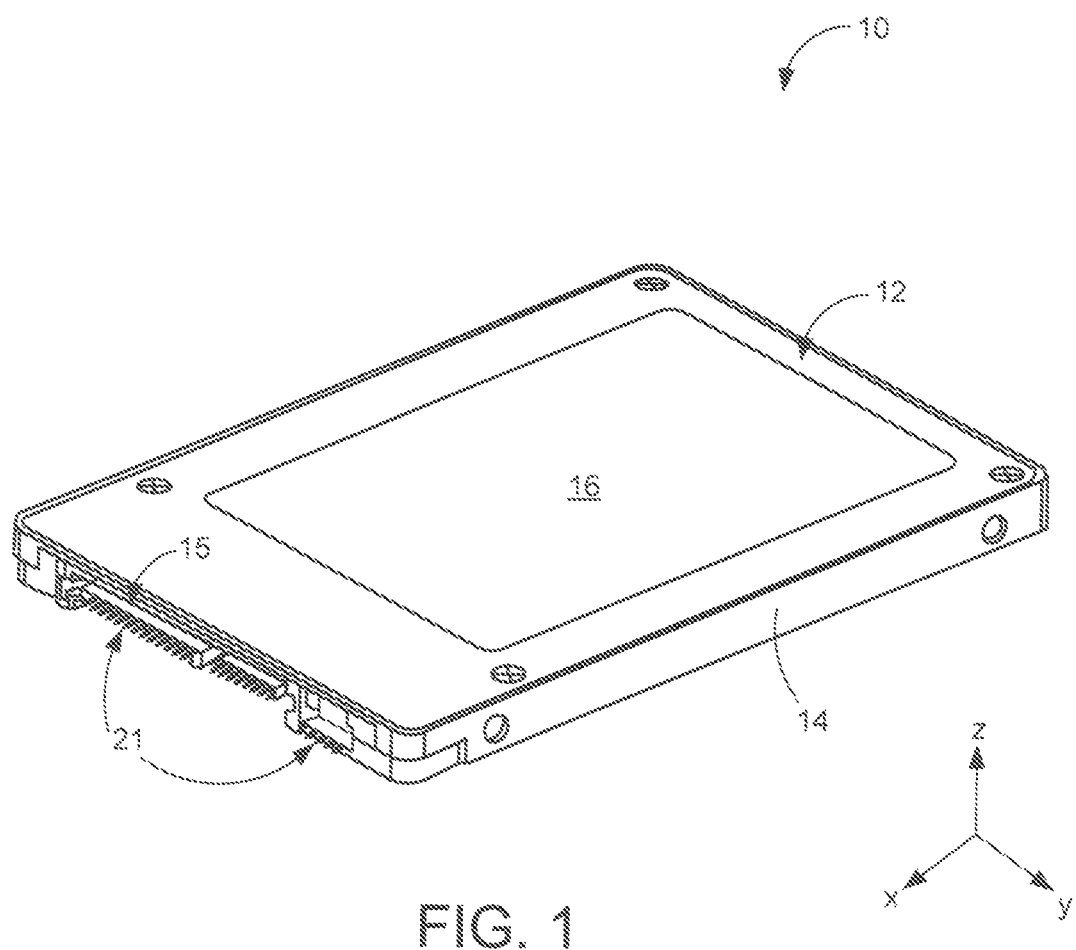
FIG. 1 is a perspective depiction of a solid state data storage assembly.

FIG. 1 is a perspective view of an example solid state data storage assembly 10, which can be a non-volatile data storage assembly. Solid state data storage assembly 10 may also be referred to as a solid-state drive. Data storage assembly 10 is suitable for use in various applications, such as computing devices, portable electronic devices or other devices that store data. Solid state data storage assembly 10 differs from non-solid state devices, such as disc drives, in that solid state data storage assembly 10 typically does not have moving parts.

Data storage assembly 10 includes outer housing 12, which is defined by frame 14, first cover 16, and a second cover 18 (shown in FIG. 2), where first and second covers 16, 18 are mechanically coupled to opposite sides of frame 12 to define a space within which electrical components of data storage assembly 10 are enclosed. Covers 16, 18 can be mechanically connected to housing 12 using any suitable technique, such as using one or more screws, connection fingers, locking/clipping structures, adhesives, rivets, other mechanical fasteners, welding (e.g., ultrasonic welding) or combinations thereof. Housing 12 may be formed from any suitable material, such as metal (e.g., aluminum), plastic, or other suitable material or combinations thereof. Housing 12 substantially encloses at least one printed circuit board assembly ("PCBA," not shown in FIG. 1), which includes electrical components, such as memory components (e.g., flash memory, magnetic random access memory (MRAM), static random access memory (SRAM) or dynamic random access memory (DRAM) chips) that store data and one or more controllers.

Figure 2:
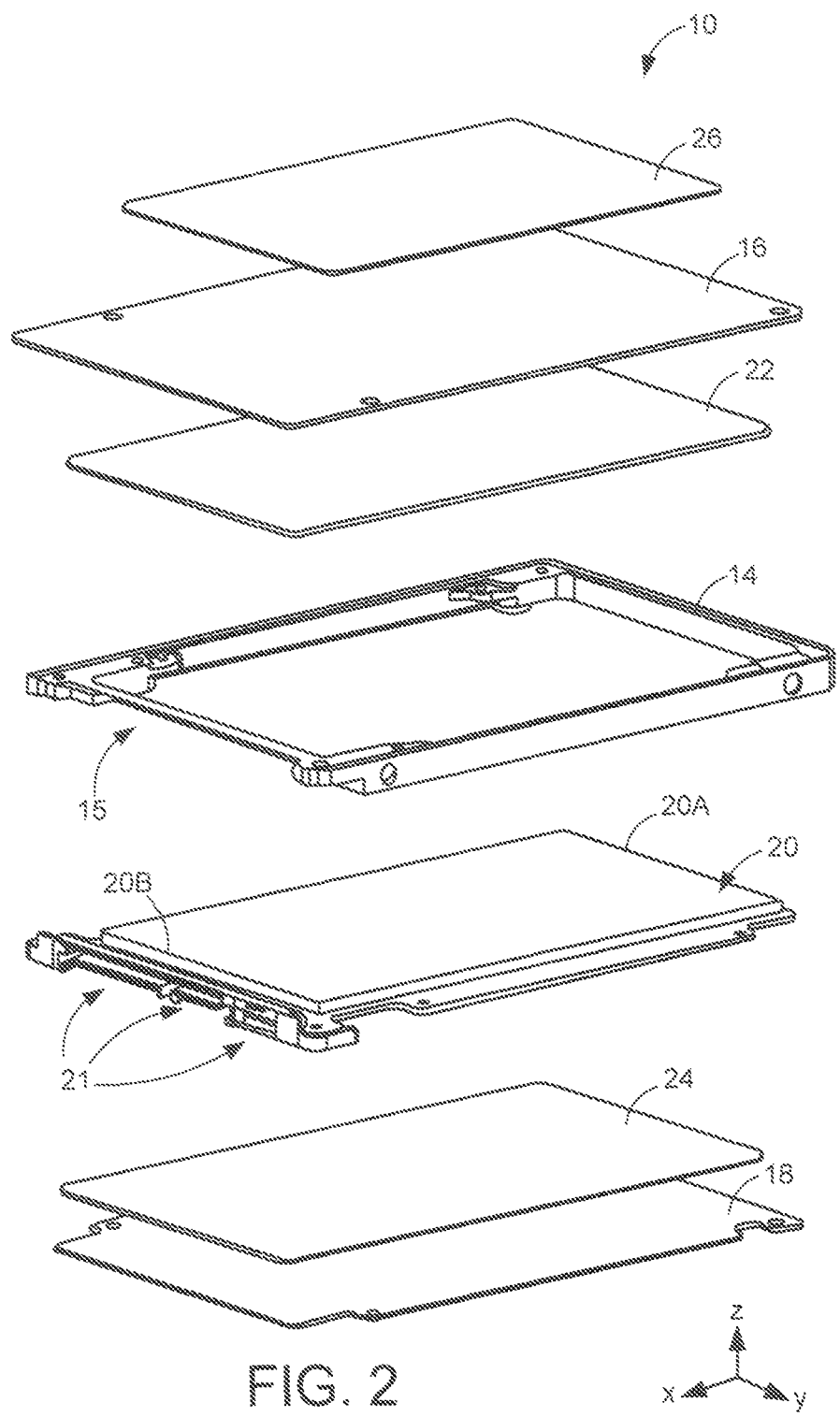
FIG. 2 is an exploded perspective depiction of the solid state data storage assembly of FIG. 1 constructed in accordance with embodiments of the present invention.

FIG. 2 is an exploded perspective view of data storage assembly 10. The example data storage assembly 10 shown in FIGS. 1 and 2 includes frame 14, first cover 16, second cover 18, PCBA 20, thermal interfaces 22, 24, and label 26. Label 26 may indicate the parameters of data storage assembly 10, e.g., the memory capacity. In other examples, data storage assembly 10 does not include label 26 or may include more than one label.

Figure 3:
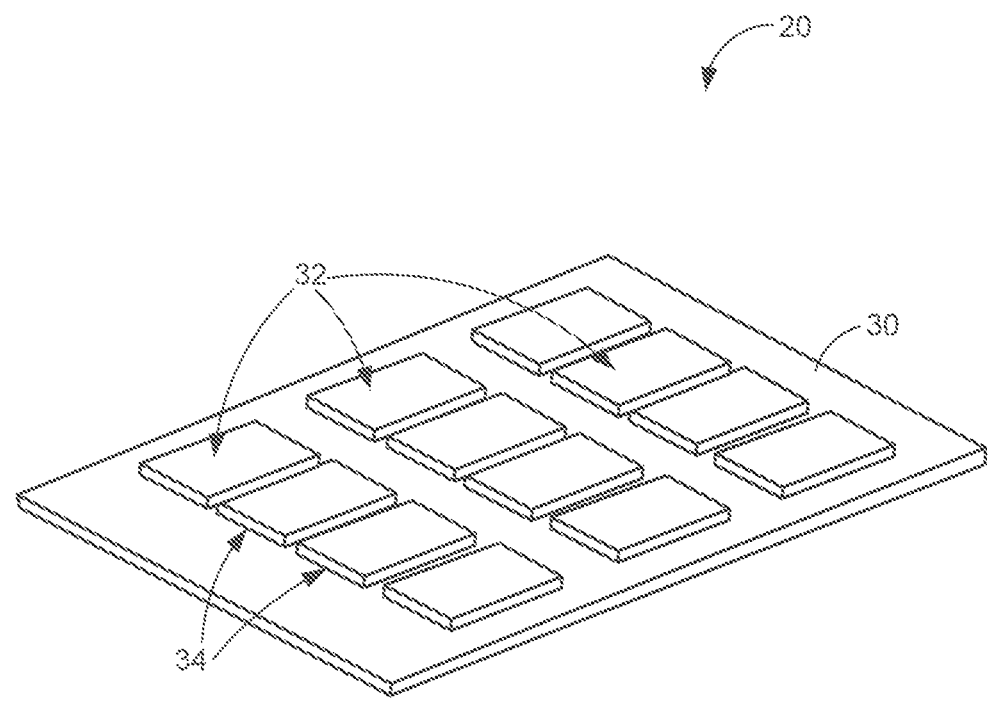
FIG. 3 is a perspective depiction of an example printed circuit board assembly ("PCBA") of the solid state data storage assembly of FIG. 1.

As shown in FIG. 3, which is a schematic illustration of an example PCBA 20, PCBA 20 can include printed circuit board 30 and electrical components 32. Electrical components 32 include components such as one or more controller chips (e.g., controller integrated circuits) that control the storage and retrieval of data by data storage assembly 10, one or more memory chips (e.g., flash memory, MRAM, SRAM or DRAM chips), one or more passive electrical components (e.g., capacitors or resistors), and the like. Electrical components 32 are electrically and mechanically coupled to printed circuit board 30 using any suitable technique, such as using solder joints or connector pins that are positioned between electrical contacts of electrical components 32 and electrical contacts on printed circuit board 30. In the example shown in FIG. 3, electrical components 32 are soldered onto printed circuit board 20 using a surface mount technology process. As a result, solder joints 34 are formed between each electrical component 32 and printed circuit board 30.

PCBA 20 may include electrical contacts that electrically connect to a plurality of input/output connectors 21, which are each configured to provide as an interface with one or more host device (e.g., a computer, a consumer electronic device, etc.). For example, input/output connectors 21 can be configured to transmit data, power and control signals to and from a host device. Example input/output connectors 21 can, but need not include a service expansion shelf (SES) connector, a serial advanced technology attachment (SATA) connector, and/or a four pin test connector. Frame 14 of housing 12 defines opening 15 through which input/output connectors 21 may be accessed. PCBA 20 can also be electrically connected to additional connectors such as, but not limited to, a pin connector (e.g., a J1 connector, which is a 110-pin connector). The additional connectors may be positioned on any suitable side of PCBA 20, such as side 20A substantially opposite side 20B on which connector 21 is positioned.

Printed circuit board 30 may include electrical components on more than one side. Thus, although electrical components 32 are shown on a single side of printed circuit board 30 in the example shown in FIG. 3, in other examples, electrical components 32 may be positioned on more than one side of printed circuit board 30 (e.g., on opposite sides of printed circuit board 30). In addition, although one PCBA 20 is shown in FIG. 2, in other examples, data storage assembly 10 may include any suitable number of PCBAs, such as two, three or more. If data storage assembly 10 includes a plurality of PCBAs, the PCBAs may be stacked in a z-axis direction (orthogonal x-y-z axes are shown in FIGS. 1 and 2), stacked in the x-y plane or any combination thereof.

During operation of data storage assembly 10, heat may be generated by electrical components 32 of PCBA 20. The generation of heat from the operation of data storage assembly 10 may be especially compounded when a plurality of data storage assemblies 10 are positioned next to each other, e.g., in a device or in a server room or other data center. As heat builds up within housing 12 (FIG. 1), the performance of data storage assembly 10 may degrade and the useful life of electrical components 32 may decrease due to the added stress on components 32 from the relatively high temperature operating environment.

The issue of heat build-up becomes particularly pronounced when housing 12 substantially encloses PCBA 20, e.g., as shown in FIGS. 1 and 2, due to limited air circulation within housing 12 as well as the relative small size of housing 12. While one or both covers 16, 18 may be removed from data storage assembly 10 in order to help improve the heat conduction of data storage assembly 10, covers 16, 18 serve various purposes in assembly 10. As a result, other issues may arise as a result of removing one or both covers 16, 18 from assembly 10. For example, covers 16, 18 provide shock protection to assembly 10 by increasing the stiffness of assembly 10. In addition, covers 16, 18 helps protect PCBA 20 and its electrical components 32 from environmental contaminants, such as dust particles, liquids, and the like. Thus, it may be undesirable to remove covers 16, 18 from housing 12 in some instances. The present embodiments leverage the use the covers 16, 18 as large "single fin" heat sinks by constructing highly thermal conductive paths for heat transfer to some or all of the components mounted to the printed circuit board, which are otherwise thermally insulated from the covers 16, 18 by being mounted to the printed circuit board.

In order to help improve the heat conduction data storage assembly 10, data storage assembly 10 includes thermal interface 22 positioned between PCBA 20 and cover 16, and thermal interface 24 positioned between PCBA 20 and cover 18. Thermal interfaces 22, 24 contact different sides of printed circuit board assembly 20. In contrast to thermally insulating material, thermal interfaces 22, 24 each comprise a thermally conductive material, which aids in the conduction of heat away from electrical components 32 of PCBA 20 and improves the thermal transfer efficiency of data storage assembly 10. In some examples, thermal interfaces 22, 24 exhibit a thermally conductivity of about 0.1 watts per meter-Kelvin (W/mK) to about 3.0 W/mK, although other thermal conductivities are contemplated. The conduction of heat away from components 32 can help maintain the operational integrity of electrical components 32 and increase the useful life of data storage assembly 10 by decreasing the stress on components 32 that is generated from relatively high operating temperatures. In some examples, thermal interfaces 22, 24 may each comprise a ceramic filled silicone elastomer.

However, other thermally conductive materials may also be used to form thermal interfaces 22, 24.

In some examples, thermal interfaces 22, 24 are formed of a substantially mechanically conformable material, such that thermal interfaces 22, 24 are capable of substantially conforming to the topography of PCBA 20. In such examples, when thermal interfaces 22, 24 are positioned over PCBA 20 and compressed, thermal interfaces 22, 24 may contact one or more surfaces of PCBA 20 (e.g., the surface of electrical components 32). Increasing the contact between thermal interfaces 22, 24 and PCBA 20 with a conformable material may be desirable in order to increase the conduction of heat away from electrical components 32. Furthermore, some of the heat generated by the electrical components 32 is directed toward and into the printed circuit board 30, potentially creating a hot spot in the area of the printed circuit board 30 where the electrical component 32 is mounted. The conformable material compressingly engaged against the PCBA 20 likewise conducts heat away from any such hot spot. For the highest power electrical components 32, such as controller application-specific-integrated-circuits ("ASICs"), it can be advantageous to concentrate the hot spot in a thermal via within the printed circuit board 30, such as metal plates on opposing sides and conductively connected together through the printed circuit board 30. The conformable TIM material 130 in that case can be compressed against the metal plate opposing the controller ASIC to enhance the transfer of heat away from the hot spot.

The materials used in constructing the thermal interfaces 22, 24 are evolving to contain higher percentages of filler materials that enhance their thermal conductivity. This has and is expected to even more stiffen the thermal interfaces 22, 24, making them less pliable and hence less capable of conforming completely around an electrical component 32 without leaving a void (air space) between the surface of the thermal interface 22, 24 and the surface of the electrical component 32. Such voids preclude heat transfer by thermal conduction and thereby diminish the overall thermal conductivity performance of the thermal interfaces 22, 24. This problem is exacerbated when two or more electrical components are closely packed together on the PCBA 20.

In addition to or instead of being formed from a substantially conformable material, thermal interfaces 22, 24 may each define a plurality of openings (e.g., cutaway portions) that are configured to receive surface protrusions of PCBA 20. The surface protrusions may be formed by the placement of electrical components 32 on printed circuit board 30 and extending from printed circuit board 30. In this way, thermal interfaces 22, 24 may better envelop electrical components 32 and increase the surface area for contacting electrical components 32 and conducting heat away from electrical components 32.

Thermal interfaces 22, 24 are each formed from one or more layers of thermally conductive material, which may be substantially continuous in order to define a path of low thermal resistance. In some examples, thermal interfaces 22, 24 each comprise multiple layers of material that may be stacked in a z-axis direction or multiple layers of material that are positioned adjacent each other in the x-y plane.

In the example of data storage assembly 10 shown in FIG. 2, thermal interfaces 22, 24 each define a structure having a stiffness that enables thermal interfaces 22, 24 to be removed from housing 12 while maintaining their structural integrity. For example, thermal interfaces 22, 24 may each be configured such that they may be removed from housing 12 without breaking apart or decomposing upon handling. As a result, thermal interfaces 22, 24 may easily be introduced into and removed from housing 12 without generating particles or other contaminants that may affect the operation of data storage assembly 10.

Configuring thermal interfaces 22, 24 such that they may each be removed from housing 12 without leaving portions of thermally conductive material within housing 12 may be useful, e.g., for purposes of accessing electrical components 32 (FIG. 3) of PCBA 20. After assembly of data storage assembly 10, it may be useful to periodically access electrical components 32 in order to repair data storage assembly 10 or otherwise rework electrical components 32. Thermal interfaces 22, 24 that are removable from data storage assembly 10 without substantially adversely affecting the properties of PCBA 20 provides a cost-effective technique for aiding the conduction of heat away from PCBA 20. In some examples, thermal interfaces 22, 24 may be reused after being removed from housing 12 (e.g., may be replaced in housing 12).

Thermal interfaces 22, 24 may have any suitable thickness. In some examples, thermal interface layers 22, 24 each have a thickness of about 0.1 millimeters (mm) to about 2.0 mm. However, other thicknesses are contemplated and may depend on the dimensions of the particular data storage assembly 10. As described below, in some examples, a thickness of each of thermal interface layers 22, 24 may be selected to fill a space between covers 16, 18 and PCBA 20 within housing 12.

When data storage assembly 10 is assembled, there may be an air gap between covers 16, 18 and PCBA 20. This air gap may act as a thermal insulator that precludes conduction of heat away electrical components 32 (FIG. 3). As a result, heat generated by components 32 may be retained within housing 12. In examples in which thermal interfaces 22, 24 are sized to fill a space between covers 16, 18, respectively, and PCBA 20, thermal interfaces 22, 24 eliminate the air gaps between covers 16, 18 and PCBA 20. Thus, by contacting both covers 16, 18 and PCBA 20, thermal interfaces 22, 24 each provide a relatively low resistance thermal conduction path from PCBA 20, a source of heat, and the exterior of housing 12 (through covers 16, 18), to which the heat may be dissipated. In this way, data storage assembly 10 is configured such that heat can be dissipated through a relatively low resistance thermal pathway including thermal interface material 22, 24, thereby reducing the operating temperatures within housing 12.

The inclusion of thermal interfaces 22, 24 in housing 12 may increase the number of potential uses of data storage assembly 10 and/or decrease the restrictions on the operating environment requirements for data storage assembly 10. For example, the increased ability of data storage assembly 10 to conduct heat away from electrical components 32 may help decrease the cooling requirements for the applications in which data storage assembly 10 is used. Depending on the application in which data storage assembly 10 is used (e.g., within a device or a server room), an external cooling source (e.g., a fan or an air conditioning unit) may be used to help maintain a desirable operating temperature for data storage assembly 10. The increased ability of data storage assembly 10 to conduct heat away from electrical components 32 may help increase the tolerable operating temperature for data storage assembly 10, which may decrease the cooling requirements for data storage assembly 10.

In addition to conducting heat away from electrical components 32 of printed circuit board assembly 20, thermal interfaces 22, 24 may help increase the mechanical robustness of data storage assembly 10. Due to the configuration and placement of thermal interfaces 22, 24 within housing 12, thermal interfaces 22, 24 help protect PCBA 20 from damage due to the application of a transient or cumulative mechanical load on housing 12. In this way, thermal interfaces 22, 24 may also be referred to as a shock protector of PCBA 20. As described in further detail below, thermal interfaces 22, 24 help increase the stiffness of data storage assembly 10, as well as limit the movement of electrical components 32 (FIG. 3) relative to printed circuit board 30 (FIG. 3) of PCBA 20.

Although solid state data storage assembly 10 can exhibit an increased mechanical robustness compared to disc drives or other data storage devices with moving parts, solid state data storage assembly 10 may still be sensitive to applied mechanical loads. That is, the comparatively higher shock and vibration specifications for the solid state data storage assembly 10 make it more susceptible to applications where mechanical loading is involved. Mechanical loads may be exerted on housing 12 of data storage assembly 10, e.g., when data storage assembly 10 is dropped or when an external force is applied to housing 12. Printed circuit board 30 may flex or bend (e.g., from a planar configuration to a nonplanar configuration) when a shock or another type of mechanical load is applied to housing 12. The bending or flexing of printed circuit board 30 may generate shear stresses that disrupt the mechanical joints between electrical components 32 and printed circuit board 30. For example, if solder joints 34 (FIG. 3) are positioned between electrical components 32 and printed circuit board 30 (FIG. 3), the bending or flexing of printed circuit board 30 may result in the deformation and shearing of solder joints 34. Some shear forces may have a magnitude sufficient to deform at least some of the solder joints 34 (or other mechanical connections between electrical components 32 and printed circuit board 30) to the point of failure. When the mechanical connections between electrical components 32 and printed circuit board 30 fail, electrical components 32 may break loose from printed circuit board 30, which disrupts the electrical connection between electrical components 32 and printed circuit board 30, and compromises the ability of data storage assembly 10 to properly operate.

Note that although the illustrative embodiments of FIG. 3 depict the electrical components 32 electrically connected to the printed circuit board 30 by way of external leads the contemplated embodiments are not so limited, in that other types of electrical connections likewise benefit such as but not limited to using ball grid arrays ("BGAs") and the like. Further, although the electrical components 32 are said to be solid state memory components for purposes of an illustrative description the contemplated embodiments are not so limited, in that other types of electrical components likewise benefit such as but not limited to the controller ASIC that performs top level control of the solid state memory components. All the advantageous heat transfer and vibration damping described herein is applicable to the controller ASIC and other electrical components as well, be they connected with external leads or BGAs or the like.

In some examples, thermal interfaces 22, 24 may be configured (e.g., sized and shaped) to help maintain the mechanical and electrical connection between electrical components 32 and printed circuit board 30 of PCBA 20 when a mechanical load is applied to housing 12. In particular, in some examples, thermal interfaces 22, 24 are sized and shaped to contact both PCBA 20 and covers 16, 18, respectively, such that the stiffness of PCBA 20 is effectively increased. Increasing the stiffness of the PCBA can help maintain the integrity of the electrical and mechanical connections (e.g., connector pins or solder joints) between electrical components 32 (FIG. 3) and printed circuit board 30 (FIG. 3) of PCBA 20 by minimizing the stresses that are generated at the electrical and mechanical connections when a mechanical load is applied to housing 12.

In particular, positioning thermal interfaces 22, 24 such as thermal interfaces 22, 24 contacting both PCBA 20 and covers 16, 18, respectively, decreases the possibility that printed circuit board 30 will bend or flex when a mechanical load is applied to data storage assembly 10. The contact between covers 16, 18, thermal interfaces 22, 24, respectively, and printed circuit board 30 creates a composite or layered structure that effectively increases the rigidity of data storage assembly 10 and decreases the amount of available space for circuit board 30 to flex, thereby discouraging the bending or flexing of printed circuit board 30. In this way, the positioning of thermal interfaces 22, 24 in housing 12 increases the stiffness of PCBA 20, thereby minimizing the magnitude of shear stresses that can result in the failure of the mechanical joints between the electrical components and the printed circuit board.

In some examples, thermal interfaces 22, 24 fill the space between PCBA 20 and covers 16, 18, respectively. As a result, when a transient mechanical load is applied to housing 12, thermal interfaces 22, 24 may help hold electrical components 32 in place on printed circuit board 30 by limiting the movement of electrical components 32 relative to printed circuit board 30. This may further help maintain the integrity of the electrical and mechanical connections (e.g., connector pins or solder joints) between electrical components 32 (FIG. 3) and printed circuit board 30 (FIG. 3) of PCBA 20 when a mechanical load is applied to housing 12.

In addition, in some examples, thermal interfaces 22, 24 help distribute a force that is applied to housing 12 across PCBA 20, thereby reducing the concentration of mechanical stress generated within PCBA 20. In this way, distributing the force across at least a part of PCBA 20 may reduce the possibility that the mechanical and electrical joints between electrical components 32 and printed circuit board 30 may break due to the application of external mechanical loads. In some cases, thermal interfaces 22, 24 also dampen the mechanical loads (e.g., shocks) or vibrations that are applied to housing 12 and transmitted to PCBA 20. For example, thermal interfaces 22, 24 may each be formed of a material that has an elastomeric property that enables thermal interfaces 22, 24 to absorb some mechanical loads that are applied to housing 12.

In some examples, thermal interfaces 22, 24 are relatively tacky, such that when thermal interfaces 22, 24 are positioned between PCBA 20 and covers 16, 18, respectively, and, sized to fill the space between covers 16, 18, respectively, and PCBA 20, thermal interfaces 22, 24 adhere to the respective cover 16, 18 and PCBA 20. In some examples, at least one of the thermal interfaces 22, 24 has a peel strength in a range of about 0.44 Newton (about 0.1 pound-force) to about 2.22 Newton (0.5 pound-force) for a 5.08 centimeter (2 inch) by 8.89 centimeter (3.5 inch) sample size relative to PCBA 20. The adhesion between thermal interfaces 22, 24 and the respective cover 16, 18 and PCBA 20 may also help increase the stiffness of data storage assembly 10, which may further improve the shock protection capability of thermal interfaces 22, 24.

In addition, the adhesion between thermal interfaces 22, 24 and the respective cover 16, 18 and PCBA 20 may provide a visible indication that data storage assembly 10 has been tampered with. For example, when thermal interfaces 22, 24 are formed from a relatively tacky material, thermal interfaces 22, 24 may adhere to PCBA 20 and the respective cover 16, 18 when data storage assembly 10 is first assembled.

However, the material from which thermal interfaces 22, 24 are formed may not allow thermal interfaces 22, 24 to re-adhere as well (if at all) to the respective cover 16, 18 and PCBA 20 after data storage assembly 10 is disassembled. Thus, if cover 16 and thermal interface 22 are separated from the other components of data storage assembly 10, e.g., to gain access to electrical components 32 of PCBA 20, such tampering with data storage assembly 10 may be evidenced by the lack of adhesion or a decrease in adhesion between thermal interface 22 and PCBA 20. The same visual indication of tampering may also be provided by thermal interface 24 if cover 18 and thermal interface 24 are separated from the other components of data storage assembly 10.

It may be desirable to determine whether the internal components of data storage assembly 10 were exposed, thereby indicating tampering with electrical components 32, for various purposes. For example, the manufacturer of data storage assembly 10 may provide a buyer with a limited warranty (e.g., covering manufacturing defects), which may be nullified if the data storage assembly 10 is tampered with. Prior to performing any warranty repairs on a data storage assembly 10, the manufacturer may determine whether data storage assembly 10 has been tampered with by examining the adhesion between thermal interfaces 22, 24 and covers 16, 18, respectively, and PCBA 20. A diminished adhesion (e.g., compared to an expected adhesion) between one or both of the thermal interfaces and PCBA 20 may indicate that the thermal interface has been removed from housing 12 and subsequently replaced in housing 12.

If thermal interfaces 22, 24 are formed from a substantially conformable material, the manufacturer may also visually inspect thermal interfaces 22, 24 to determine whether the pattern defined by the surface of thermal interfaces 22, 24 facing PCBA 20 substantially matches the expected pattern of a thermal interface 22 that has been first removed from housing 12. If pattern defined by the surface of one or both thermal interfaces 22, 24 differs from the expected pattern, it may indicate that the thermal interface has been removed from housing 12 and subsequently replaced in housing 12, thereby indicating data storage assembly 10 has been tampered with.

EXAMPLE

An experiment was performed to compare the shock resistance of a solid state drive assembly including a thermally conductive interface material compared to a solid state drive assembly that is otherwise similar, but does not include a thermally conductive interface material. A ½ sine pulse shock was applied to a solid state drive assembly including a housing similar to housing 12 shown in FIGS. 1 and 2 and a PCBA including a plurality of electrical components soldered to a printed circuit board. In particular, a solid state drive assembly was dropped using a Lansmont Drop Tester (made available by Lansmont Corporation of Monterey, Calif.), which helped maintain the desired orientation of the solid state drive assembly as it was dropped. The acceleration at which the drive assemblies were dropped was determined using Model 352A25 and Model 352C22 accelerometers (made available by PCB Piezotronics, Inc. of Depew, N.Y.).

A plurality of solid state drive assemblies each having a different printed circuit board thickness and excluding a thermal interface material were dropped in various orientations. Table 1 illustrates the accelerations with which the solid state drive assemblies were dropped, the thickness of the printed circuit board of the solid state drive assembly, and a duration of each of the drops.

TABLE 1

| Iteration | Z-axis Acceleration (G) | Y-axis Acceleration (G) | X-axis Acceleration (G) | Duration of Load Application | Pass/Fail | Orientation | Printed Circuit Board Thickness |
|---|---|---|---|---|---|---|---|
| 1 | 1500 G | 0 | 0 | 0.52 ms | Pass | Memory Array Up | 0.76 mm |
| 2 | 1500 G | 0 | 0 | 0.52 ms | Pass | Memory Array Up | 0.76 mm |
| 3 | 1567 G | 0 | 0 | 0.52 ms | Fail | Memory Array Up | 0.76 mm |
| 4 | 1508 G | 0 | 0 | 0.52 ms | Pass | Memory Array Up | 0.94 mm |
| 5 | 0 | 1537 G | 0 | 0.51 ms | Pass | I/O Connector down | 0.94 mm |
| 6 | 0 | 0 | 1584 G | 0.51 ms | Pass | Four pin Connector Up | 0.94 mm |
| 7 | 0 | 0 | −1332 G | 0.52 ms | Pass | Four pin Connector Down | 0.94 mm |
| 8 | 0 | −1523 G | 0 | 0.50 ms | Pass | I/O Connector Up | 0.94 mm |
| 9 | −1534 G | 0 | 0 | 0.52 ms | Fail | Memory Array Down | 0.94 mm |
| 10 | 1521 G | 0 | 0 | 0.50 ms | Pass | Memory Array Up | 1.20 mm |
| 11 | 0 | 1618 G | 0 | 0.48 ms | Pass | I/O Connector down | 1.20 mm |
| 12 | 0 | 0 | 1385 G | 0.48 ms | Pass | Four pin Connector Up | 1.20 mm |
| 13 | 0 | 0 | −1449 G | 0.47 ms | Pass | Four pin Connector Down | 1.20 mm |
| 14 | 0 | −1440 G | 0 | 0.48 ms | Pass | I/O Connector Up | 1.20 mm |
| 15 | −1514 G | 0 | 0 | 0.50 ms | Fail | Memory Array Down | 1.20 mm |

In each of the iterations, the solid state drive assembly was dropped with the solid state drive assembly oriented such that the electrical components were facing in either a positive z-axis direction ("memory array up") or a negative-z-axis direction ("memory array down"), such that the input-output (I/O) connector of the solid state drive assembly was face down (e.g., electrical components facing in positive y-axis direction) or face up (e.g., electrical components facing in negative y-axis direction), or such that a four pin connector of the solid state drive assembly was face up (e.g., electrical components facing in positive x-axis direction) or face down (e.g., electrical components facing in negative x-axis direction). In each of the solid state drive assemblies that were dropped, the four pin connector and the I/O connector are positioned on opposite sides of a housing of the solid state drive assembly.

Iterations 1-3 shown in Table 1 represent the dropping of three solid state drive assemblies each having a printed circuit board thickness of about 0.76 millimeters (mm). Iterations 4-9 shown in Table 1 represent the dropping of a single solid state drive assembly having a printed circuit board thickness of about 0.94 mm. In each subsequent drop for iterations 4-9, the solid state drive assembly was rotated, such that the consequences of dropping the solid state drive assembly in each of a plurality of orientations was determined. Iterations 10-15 shown in Table 1 represent the dropping of a single solid state drive assembly having a printed circuit board thickness of about 1.20 mm. In each subsequent drop for iterations 10-15, the solid state drive assembly was rotated, such that the consequences of dropping the solid state drive assembly in each of a plurality of orientations was determined.

A solid state drive assembly was considered to fail the shock test if, upon visual inspection, any of the electrical components were loose or had fallen off the printed circuit board of the solid state drive assembly. As Table 1 demonstrates at least some of the solid state drive assemblies that did not include a thermal interface material were unable to withstand the applied shock. In particular, the solid state drive assemblies showed a sensitivity to accelerations in a negative z-axis direction.

A solid state drive assembly similar in configuration to those tested to generate the data shown in Table 1 was modified to include a thermal interface material between the covers of the housing and the PCBA. The thermal interface material was Bergquist Gap Pad 2202, which is available from Bergquist Company of Chanhassen, Minn., and was selected to have a thickness of about 0.051 mm (about 0.020 inches) to fill the space between the covers of the housing and the PCBA. The solid state drive assembly including a thermal interface material was dropped five times using the Lansmont Drop Tester to determine whether the thermal interface material helped improve the ability of the solid state drive assembly to withstand a shock applied to the outer housing.

Table 2 illustrates the various accelerations with which the solid state drive assembly was dropped, as well as the thickness the printed circuit board and a duration of the drop. As with the testing performed to generate the data shown in Table 1, the solid state drive assembly was considered to fail the shock test if, upon visual inspection, any of the electrical components (e.g., memory chips) were loose or had fallen off the printed circuit board of the solid state drive assembly.

material improves the shock protection of a solid state drive assembly, and, in particular, the electrical components of a PCBA.

Figure 4:
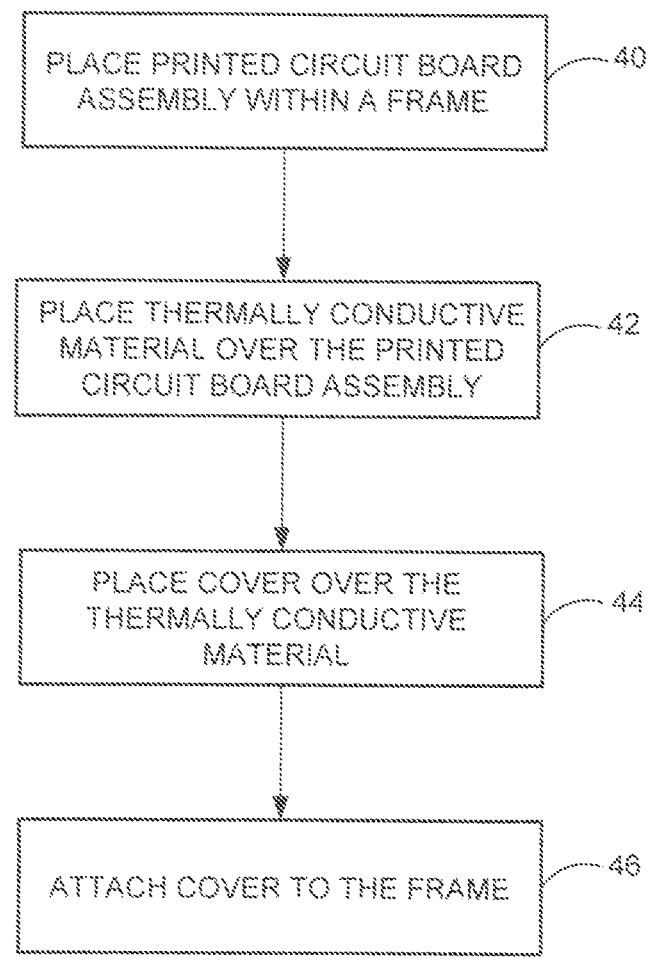
FIG. 4 is a flow diagram of an example technique for forming the solid state data storage assembly of FIG. 2.

FIG. 4 is a flow diagram of an example technique for forming solid state data storage assembly 10. In accordance with the technique shown in FIG. 4, one or more PCBAs 20 are placed within frame 14 (40). The one or more PCBAs 20 can be attached to frame 14 using any suitable technique. In some examples, frame 14 includes side rails, brackets or other mechanical structures that align with and support the one or more PCBAs 20. The one or more PCBAs 20 can be mechanically connected to these side rails, brackets or other mechanical structures of frame 14. For example, the one or more PCBAs can be connected to frame 14 using one or more screws, connection fingers, locking/clipping structures, adhesives, rivets, other mechanical fasteners, welding (e.g., ultrasonic welding) or combinations thereof.

After placing one or more PCBAs 20 within frame 14, thermally conductive material defining thermal interface 22 is placed over PCBA 20 (42). In some examples, the thermally conductive material is placed over PCBA 20 such that the major surface of PCBA 20 that is exposed by frame 14 is substantially covered by the thermally conductive material. In this way, thermal interface 22 may be sized and shaped to substantially cover PCBA 20. After the thermally conductive material is placed over PCBA 20 to define thermal interface 22 (42), cover 16 is positioned over thermal interface 22 (44) and attached to frame 14 (46). Cover 16 can be attached to frame 14 using any suitable technique, such as screws, connection fingers, locking/clipping structures, adhesives, rivets, other mechanical fasteners, welding (e.g., ultrasonic welding) or combinations thereof.

Thermally conductive material can be pre-attached to cover 16 or can separate from cover 16 prior to inclusion in housing 12. In some examples, thermal interface 22 has a thickness that is greater than or equal to a distance between cover 16 and PCBA 20. As a result, when cover 16 is positioned over thermal interface 22 (44) and attached to frame 14 (46), thermal interface 22 substantially fills the space between cover 16 and PCBA 20. In addition, in examples in which thermal interface 22 has a thickness that is greater than a distance between cover 16 and PCBA 20, the attachment of cover 16 to frame 14 compresses thermally interface 22, which may further increase the stiffness of data storage assembly 10. As discussed above, this may help reduce the possibility that printed circuit board 30 (FIG. 3) bends or flexes in the z-axis direction, which can help maintain the

TABLE 2

| Iteration | Z-axis Acceleration (G) | Y-axis Acceleration (G) | X-axis Acceleration (G) | Duration of Load Application | Pass/Fail | Orientation | Printed Circuit Board Thickness |
|---|---|---|---|---|---|---|---|
| 1 | −1513 G | 0 | 0 | 0.52 ms | Pass | Memory Array Up | 1.20 mm |
| 2 | −1637 G | 0 | 0 | 0.52 ms | Pass | Memory Array Up | 1.20 mm |
| 3 | −1765 G | 0 | 0 | 0.52 ms | Pass | Memory Array Up | 1.20 mm |
| 4 | −1867 G | 0 | 0 | 0.52 ms | Pass | Memory Array Up | 1.20 mm |
| 5 | −1957 G | 0 | 0 | 0.52 ms | Pass | Memory Array Up | 1.20 mm |

As Table 2 demonstrates, the solid state drive assembly including a thermal interface material positioned between the covers of the housing and the printed circuit board assembly was able to withstand accelerations up to 1957 G when the solid state drive assembly was dropped with the electrical components (e.g., the memory array) facing in a positive z-axis direction. This suggests that the thermal interface integrity of the mechanical and electrical connection between electrical components 32 (FIG. 3) and printed circuit board 30.

In some examples of data storage assembly 10, housing 12 may include a single cover. In other examples, however, housing 12 of data storage assembly 10 includes two covers (e.g., as shown in FIG. 1) or more than two covers. Thus, in some examples of the technique shown in FIG. 4, a thermal conductive material may also be placed over the opposite surface of PCBA 20 to define second thermal interface 24, and second cover 18 may subsequently be positioned over second thermal interface 24 and attached to frame 14.

Figure 5:
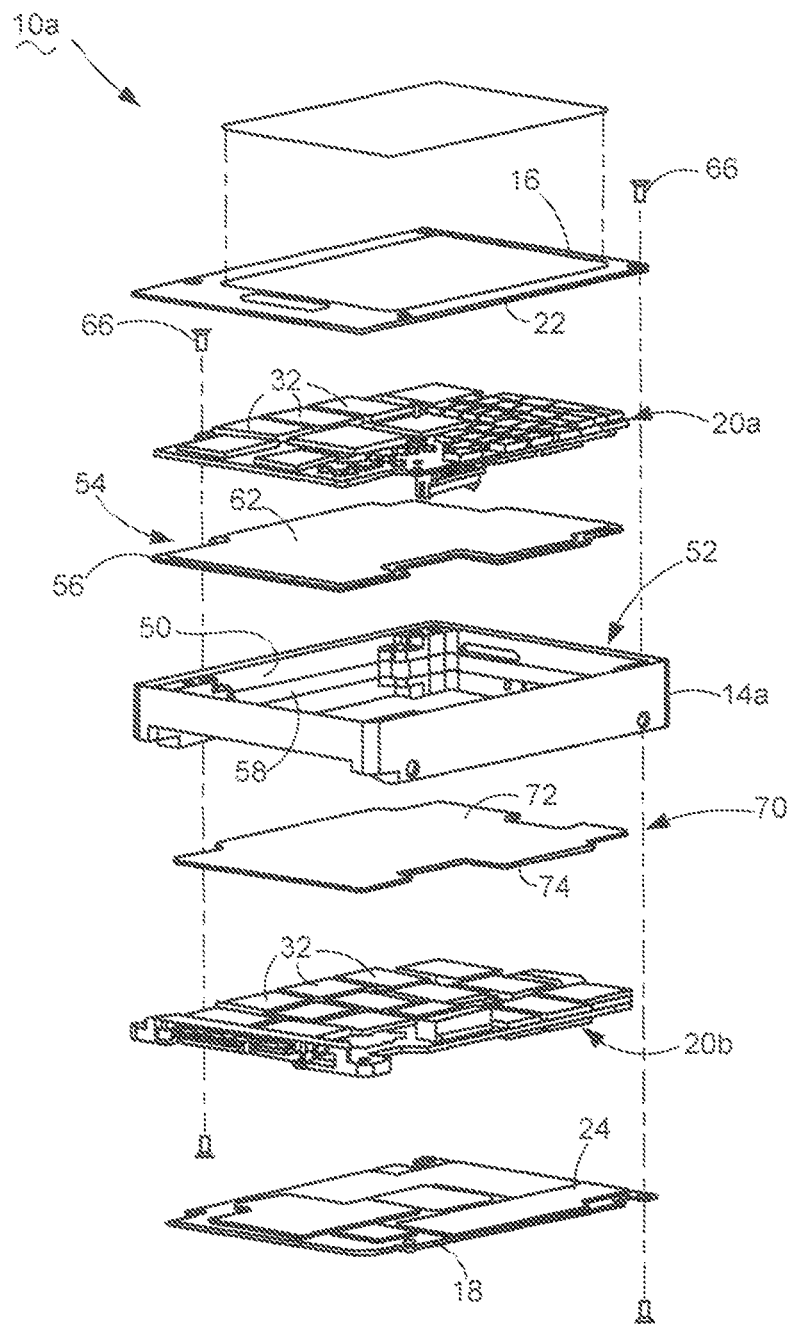
FIG. 5 is an exploded perspective depiction of the solid state data storage assembly of FIG. 1 constructed in accordance with embodiments of the present invention.

There being "more than two covers" generally contemplates embodiments in which there can be one or more internal cover(s) in addition to the two external covers 16, 18 discussed above. Also as previously discussed, some embodiments contemplate the data storage assembly having a plurality of PCBAs in the same enclosure. FIG. 5 is an exploded perspective depiction of illustrative embodiments in which the frame 14a has a perimeter surface 50 defining a passage 52 into which two PCBAs 20a, 20b can fit. As discussed previously, each of the PCBAs 20a, 20b has a plurality of solid state memory components ("components") 32, as well as other electronic components, operably generating heat that is necessarily controlled in accordance with embodiments of this invention. As described above, the thermal interface 22 contactingly engages and thereby conducts heat away from the components 32 during their operation. That is, the thermal interface 22 conducts the heat to the cover 16 which sheds the heat load by convection, such as can be enhanced by a directed airflow over the data storage assembly enclosure.

However, heat can build up in the space inside the enclosure on the other side of the PCBA 20a, especially where components 32 are mounted on that opposing side of the PCBA 20a. The data storage assembly 10a is incapable of conductively shedding heat from the components 32 on the opposing side of the PCBA 20a; it is a dead air space. Clarifying, for purposes of this description and meaning of the appended claims the term "dead air space" is an area inside the enclosure where there is no conductive heat transfer path from the components 32 to the enclosure. The components 32 are attached to the printed circuit board 30 which might, in turn, be in contact with the enclosure. However, the printed circuit board 30 is not intended, and hence not constructed, to be a thermally conductive structure and as such does not provide a significant conductive heat transfer path directly from a selected component 32 to the external enclosure as that term "thermally conductive structure" is meant in accordance with these embodiments. That is, although the printed circuit board 30 includes metallic traces forming electrical circuitry, and those metallic traces do conduct heat generated by the components 32, the embodiments of the present invention contemplate thermally conductive structures that conduct heat away from the components 32 along non-electrical pathways to prevent the buildup of deleterious heat in the electrical circuitry and in adjacent components 32 connected to the electrical circuitry. The heat load in the dead air space is exacerbated when both of the sides of the PCBAs 20a, 20b forming the dead air space have mounted components 32 that operably generate heat.

To conduct heat out of the dead air space an internal cover 54 is disposed within the passage 52 on the opposing side of the PCBA 20a from the external cover 16. It will be noted that here the internal cover 54 and the external cover 16 are substantially parallel to each other, and that they cooperate with the frame 14a to enclose the PCBA 20a. The internal cover 54 is constructed of a rigid layer 56 that is thermally conductive, such as made of steel or aluminum and the like. In these illustrative embodiments the rigid layer 56 is connected in direct contact with the frame 14a, and for that reason the frame 14a is likewise constructed of a thermally conductive material such as aluminum or steel and the like.

Figure 6:
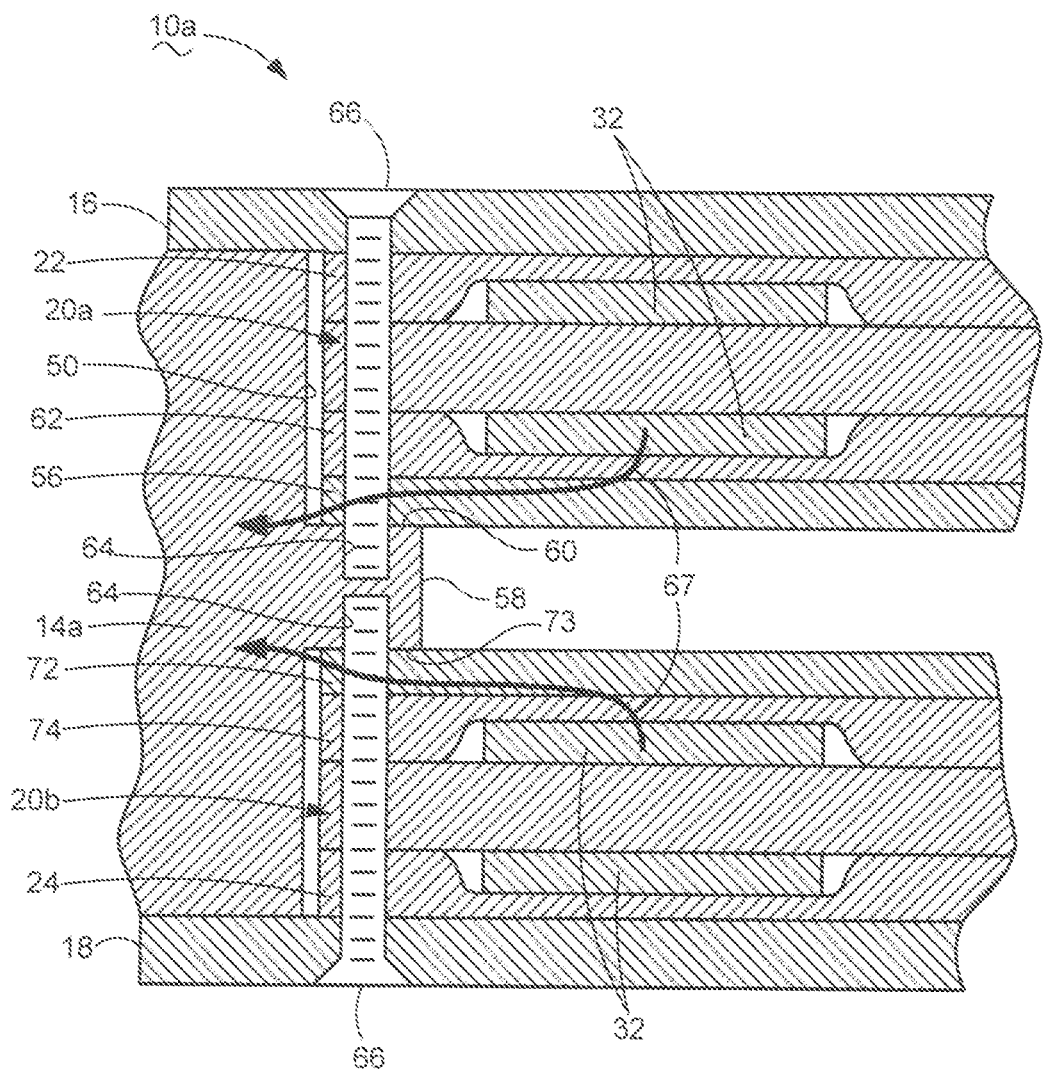
FIG. 6 is a cross-sectional depiction of a portion of the solid state data storage assembly of FIG. 5.

FIG. 6 is a partial cross-sectional depiction of the data transfer assembly 10a depicting the frame 14a defining a protuberant rail 58 extending from the peripheral surface 50. The protuberant rail 58 includes an upper (as depicted here) surface 60 upon which the rigid layer 56 is supported. A compressible conductive layer 62, such as used in constructing the thermal interfaces 22, 24, is compressingly sandwiched between the rigid layer 56 and the PCBA 20a. The compressible conductive layer here and elsewhere is sometimes referred to as the thermal interface material ("TIM"). For example, without limitation, the compressible conductive layer 62 can be adhered or otherwise joined to the rigid layer 56, or the compressible conductive layer 62 can be stacked onto the rigid layer 56. An attachment feature 64 in the rail 58, such as the depicted threaded bore, can be sized to receivingly engage a fastener 66 that attaches both the external cover 16 and the internal cover 54, as well as the sandwiched compressible members 62, 22, respectively, to the frame 14a. The contacting engagement of the compressible conductive layer 62 creates a thermally conductive path for conducting heat from the component 32 to the rigid layer 56. The contacting engagement of the rigid layer 56 against the protuberant rail 58 extends that thermally conductive path for conducting heat to the external surface of the rail 14a where the heat can be shed by convection to the surrounding environment. The entire path for conducting heat from the component 32 is depicted by the enlarged arrow 67.

In the same way in these embodiments another internal cover 70 (FIG. 5) is parallel to the external cover 18 on opposing sides of the PCBA 20b, such that the covers 70, 18 and the frame 14a enclose the PCBA 20b. The internal cover 70 has a rigid layer 72 constructed like the rigid layer 56. A surface 73 of the protuberant rail 58 provides a lower (as depicted here) surface against which the rigid layer 72 is supported. The gap between the rigid layers 56, 72, as defined by the height (as depicted here) of the protuberant rail 58, can be sized as appropriate for clearance purposes of the overall assembly such as to provide space for one or more electrical connectors joining the PCBAs 20a, 20b together.

A compressible conductive layer 74, like the compressible conductive layer 62, is compressingly sandwiched between the rigid layer 72 and the PCBA 20b. As before, the compressible conductive layer 74 can be adhered or otherwise joined to the rigid layer 72, or the compressible conductive layer 74 can be stacked onto the rigid layer 72. Another attachment feature 64, such as the depicted threaded bore, can be sized to receivingly engage a fastener 66 that attaches both the external cover 18 and the internal cover 70, as well as the sandwiched compressible members 74, 24, respectively, to the frame 14a. The contacting engagement of the compressible conductive layer 74 creates a thermally conductive path for conducting heat from the component 32 to the rigid layer 72. The contacting engagement of the rigid layer 72 against the protuberant rail 58 extends that thermally conductive path for conducting heat to the external surface of the rail 14a where the heat can be shed by convection to the surrounding environment. The entire path for conducting heat from the component 32 is depicted by the enlarged arrow 67.

Figure 7:
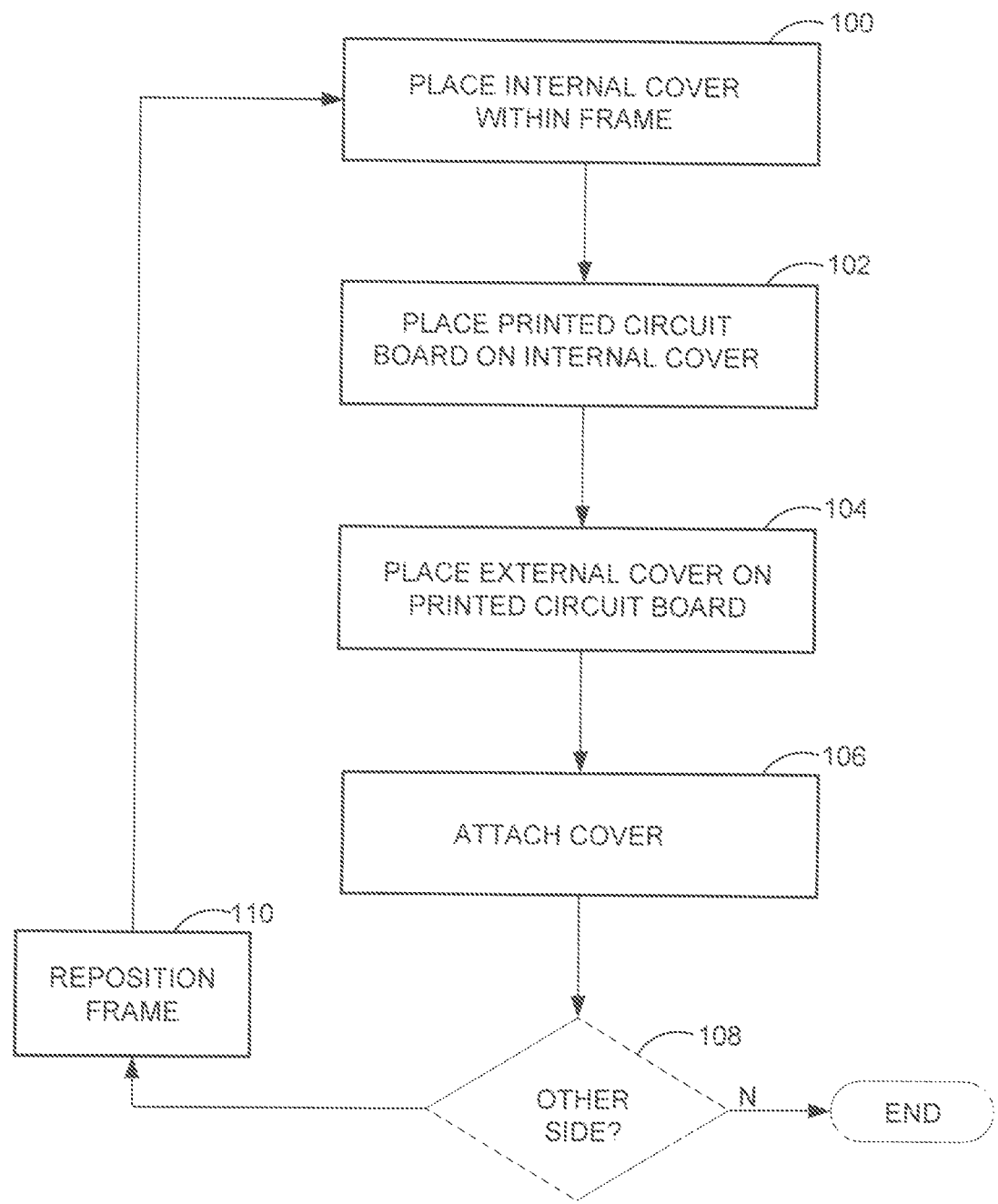
FIG. 7 is a flow diagram of an example technique for forming the solid state data storage assembly of FIG. 5.

The protuberant rail 58 and open passage 52 arrangement advantageously simplifies the manufacturing methodology employed to assemble the data storage assembly 10a. FIG. 7 is a flow diagram of an illustrative technique for forming the solid state data storage assembly 10a. In these embodiments the frame 14a is suitably supported, such as in an assembly fixture and the like, such that the internal cover 54 is positioned within the passage 52 and supported upon the rail 58 (100). The frame 14a can advantageously be positioned horizontally in order that gravity can assist in positioning the internal cover 54 on the rail 58. From the above description it is noted that the internal cover 54 can include both the rigid layer 56 and the compressible conductive layer 62, so either the layers 56, 62 are positioned as a unitary assembly or they are positioned individually and in order (100). The PCBA 20a is then positioned within the passage 52 upon the internal cover 54 (102). The external cover 16 is then positioned against the frame 14a (104). In embodiments where the compressible thermal interface 22 is included then the layers 16, 22 are either positioned as a unitary assembly or the layers 16, 22 are positioned individually and in order. A plurality of fasteners 66 are then coupled at distal ends thereof to the respective attachment features 64 in the rail 58 to attach both covers 54, 16 and the PCBA 20a to the rail 58, and to also compressingly sandwich the thermal interface materials 62, 22 therebetween (106).

With the top (as depicted) half assembled a determination is then made as to whether the other side needs to be assembled (108). If the determination is "no," then the technique ends. Otherwise, if the determination is "yes," then optionally the frame 14a can be repositioned to facilitate the further assembly operations (110). For example, if the frame 14a is positioned horizontally during the assembly above for the advantage of using gravity to assist in positioning the components of assembly, then the frame 14a can be rotated 180 degrees so that it is presented in the same advantageous position for assembling the rest of the components of assembly.

In any event, control returns to the beginning of the technique such that the internal cover 70 is positioned within the passage 52 and supported upon the rail 58 (100). Again, from the above description it is noted that the internal cover 70 can include both the rigid layer 72 and the compressible conductive layer 74, so either the layers 72, 74 are positioned as a unitary assembly or they are positioned individually and in order (100). The PCBA 20b is then positioned within the passage 52 upon the internal cover 70 (102). The external cover 18 is then positioned against the frame 14a (104). In embodiments where the compressible thermal interface 24 is included then the layers 18, 24 are either positioned as a unitary assembly or the layers 18, 24 are positioned individually and in order. A plurality of fasteners 66 are then coupled at distal ends thereof to the respective attachment features 64 in the rail 58 to attach both covers 70, 18 and the PCBA 20b to the rail 58, and to also compressingly sandwich the thermal interface materials 74, 24 therebetween (106).

All of the foregoing embodiments employing internal covers 54, 70 are used in an enclosure that is constructed of two external covers 16, 18, although the contemplated embodiments are not so limited. In equivalent alternative embodiments of a data storage assembly (not depicted) a unitary closed-bottom frame can be employed with the components of assembly described above assembled in the same arrangement but from bottom-up. Instead of the protuberant rail or some like attachment feature extending from the frame, a spacer can be included in the stack between the rigid layers of the opposing internal covers.

Figure 9:
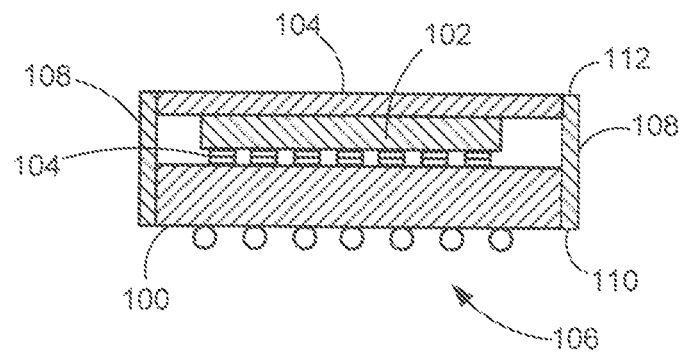
FIG. 9 is a cross-sectional depiction of the circuitry package of FIG. 5.

FIG. 8 is an exploded isometric depiction of the component 32 in the manner that it is typically found in the form of a protuberant cuboid extending from the substantially planar surface of the printed circuit board 30. FIG. 9 is cross-sectional diagrammatic depiction of the component 32 more particularly shown as an integrated circuit ("IC") over molded package 32, or also referred to herein generally as a circuitry package 32. The circuitry package 32 has a substrate 100 upon which an IC chip 102 is electrically connected by a plurality of internal connections such as solder joints 104 between corresponding leads or contacts embedded in underfill 105. The substrate 100 has a number of electrical traces, layers, and vias (not depicted) to communicate with the input/output ("I/O") signal traces of the IC chip 102 by a number of external connections 106, such as the ball grid array 106 depicted in these illustrated embodiments. The ball grid array 106 is arranged to be connected to corresponding electrical traces or contacts on the printed circuit board 30 (not depicted in FIG. 9).

The IC chip 102 is enclosed by the over molded package constructed by a peripheral edge 108 that extends from a proximal end 110 adjacent the printed circuit board 30 to a distal end 112. A cap 114 spans the distal end 112 to cooperatively enclose the IC chip 102.

Returning momentarily to FIG. 6 it will be understood that in those embodiments the square corners of the circuitry package 32 compress the thermal interface material ("TIM") 22, 24, 62, 74 such that there is consistent contact between the cap 114 and the TIM but there is an air gap between the peripheral edge 108 and the TIM. It has been determined through reduction to practice of the present embodiments that significantly improved thermal heat transfer of heat away from the circuitry package 32 can be accomplished by modified embodiments of the TIM that eliminate the air gaps in the embodiments depicted by FIG. 6, instead providing consistent physical contact of the TIM against the entire peripheral edge 108 of the circuitry package 32.

FIG. 9 also depicts a modified TIM 116 that is flipped upside-down with respect to its operable orientation relative to the circuitry package 32. The TIM 116 is operably disposed between one of the covers 16, 18, 56, 72 and the corresponding PCBA 20a, 20b as described in FIG. 6. The TIM 116 has a planar surface 118 that contactingly engages the printed circuit board 30 as described in FIG. 6. However, the TIM 116 generally defines an opening 120 that is sized to receivingly engage the circuitry package 32 in a close mating engagement. That is, in these illustrative embodiments in which the circuitry package 32 is a protuberant cuboid, the TIM 116 has upstanding (as depicted) sides 122 terminating at a planar top surface 124 cooperatively defining the opening 120. Note that the depth 126 of the opening 120 is less than the thickness 128 of the TIM 116 so that the TIM 116 is compressed between the cap 114 and the respective cover 16, 18, 56, 72. In some embodiments the openings can be formed, such as molded, into the TIM such that it is unitarily constructed. Alternatively, the TIM can be constructed by joining two layers, one layer defining the opening and the other layer being solid.

Figure 10:
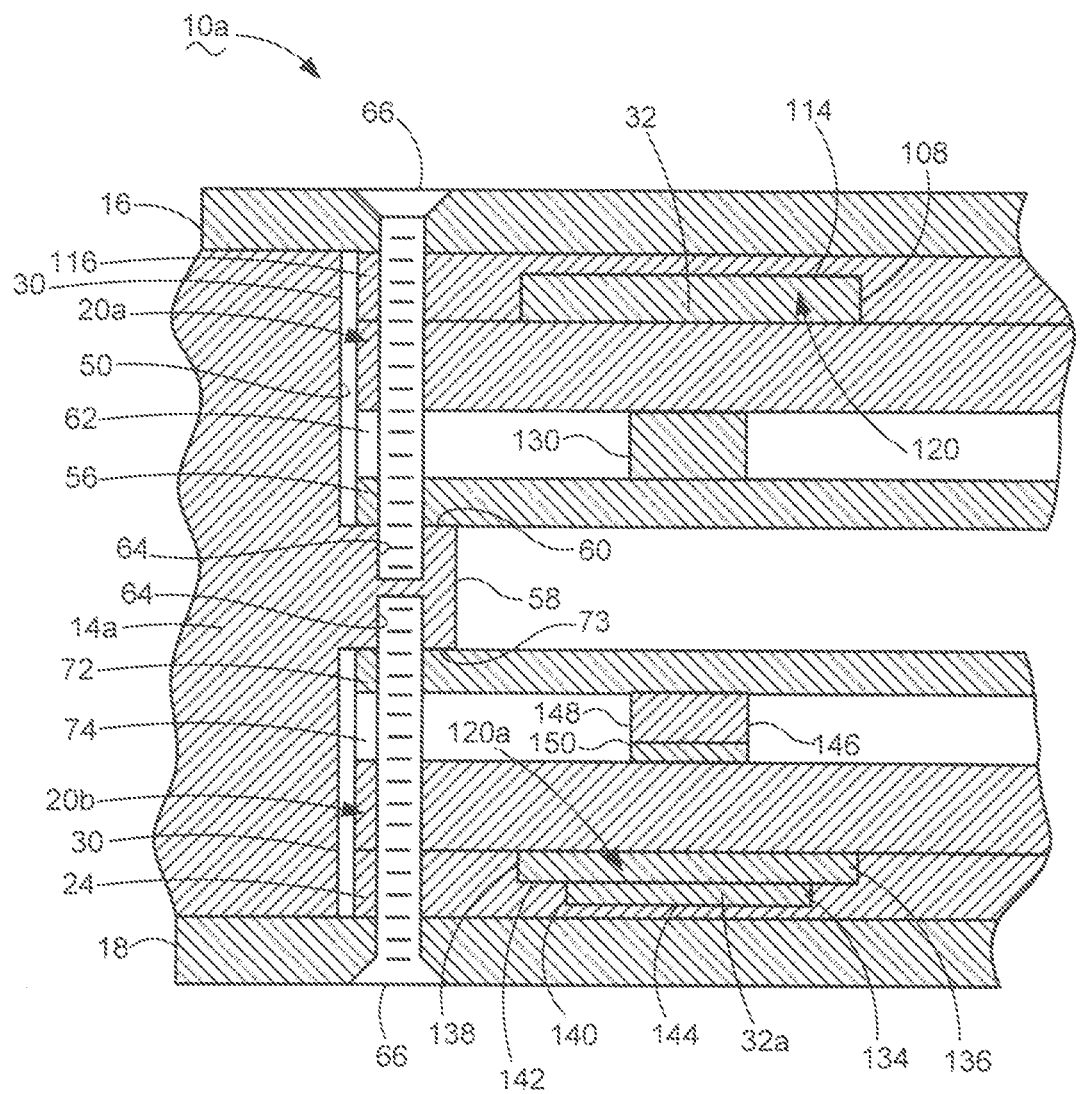
FIG. 10 is a cross-sectional depiction similar to FIG. 6 but constructed in accordance with alternative embodiments of the present invention.

FIG. 10 is a view similar to FIG. 6 but depicting the TIM 116 compressingly sandwiched between the cover 16 and the PCBA 20a. The opening 120 in the TIM 116 advantageously receivingly engages the circuitry package 32 in the close mating engagement operably contacting the TIM 116 simultaneously against the cap 114 and against the peripheral edge 108 to conduct heat away from the circuitry package 32.

Note that in these illustrative embodiments the peripheral edge 108 extends substantially orthogonally to the printed circuit board 30. In alternative equivalent embodiments the shape of the peripheral edge can vary, in such case the opening in the TIM is altered to receive the circuitry package in the close mating engagement that simultaneously contacts both the peripheral edge (sides) and the cap (top) of the circuitry package. The package edge and cap can be formed any of a number of ways such as the top being a separate component or molded altogether, and such as defining a flat top surface or a top hat stepped surface. In the case of a flip chip the top hat shape is formed by stacking two dies. Likewise, in these illustrative embodiments the cap is substantially parallel to the printed circuit board but the contemplated embodiments are not so limited. In the same manner, in alternative embodiments the cap can vary and in such case the TIM is altered to receive the circuitry package in the close mating engagement.

Note as well that the foregoing described one opening in the TIM for one circuitry package, but the contemplated embodiments are not so limited. For example, it is contemplated in the embodiments of FIG. 5 that the TIM 22 has a plurality of openings sized and arranged to receivingly engage many or all of the circuitry packages 32 as well as other components shown on the top side (as depicted) of the PCBA 20a. In some embodiments the size of one such opening is a different size than another one of the openings.

FIG. 10 also depicts a heat conductor 130 attached to the other side of the printed circuit board 30 in the PCBA 20a instead of another circuitry package 32. In some circumstances the heat generated by one of the circuitry packages 32 is high enough that it must be controllably segregated from other components on the PCBA. For example, the controller application-specific-IC ("ASIC") in the solid-state drive ("SSD") previously described consumes a lot of power and concomitantly generates a lot of heat.

A significant part of the heat flux is downward (as depicted) from the IC 102 (FIG. 9) into the substrate 100 and, in turn, into the printed circuit board 30 to which it is attached. The thermal conduction through the cap 114 into the cover 16 cannot remove all the downward-directed heat flux, such that the printed circuit board 30 can become a hot spot. Left unchecked, the hot spot can cause a rise in junction temperature of the controller ASIC, degrading efficiency and resulting in even more power consumption which becomes a potential failure mode for runaway temperature. The hot spot can also migrate to adjacent electronic components which cannot be expected to operate reliably at or above rated case temperatures.

The heat conductor 130 resolves any hot spot concerns by conducting heat from the printed circuit board 30 to the internal cover 56 which, as described above, conducts the heat to the frame 14a where it can be shed by convection to the external environment. Preferably, the heat conductor 130 is constructed of a highly conductive material such as a non-compressible layer of aluminum or similar metal.

The heat conductor 130 is attached to the printed circuit board 30 in overlapping opposition to the circuitry package 32 in order to conduct heat away that is generated by the circuitry package 32. That is, by "overlapping opposition" it is meant that the heat conductor 130 and the circuitry package 32 overlap each other at least partially on opposite sides of the printed circuit board 30. This defines a proximity of the heat conductor 130 to the source of the heat it is designed to conduct away from the PCBA.

It is not unusual that these high operating temperature circuitry packages, such as the SSD controller ASIC, are constructed of a flip chip 32a in the PCBA 20b in FIG. 10. The flip chip 32a is constructed of one IC 134 being electronically connected to another IC 136 which, in turn, is electronically connected to the printed circuit board 30 in the PCBA 20b. In this event, as described above, the opening 120a in the TIM 24 is configured with a step to receivingly engage the flip chip 32a in the close mating engagement that contacts the TIM 24 against both peripheral edges 138, 140 and against both caps 142, 144 of the ICs 134, 136, respectively.

Another heat conductor 146 is attached to the PCBA 20b in overlapping opposition to the flip chip 32a. The heat conductor 146 is constructed of a non-compressible portion 148 that can be selected to optimize the thermal conductivity performance, such as by making it of aluminum as described. The non-compressible portion 148 is attached to a compressible layer 150, such as another layer of TIM 150. In alternative equivalent embodiments (not depicted) the heat conductor can have two or more layers of TIM, such as but not limited to a non-compressible portion sandwiched between opposing layers of TIM. The compressibility of the heat conductor 146 advantageously maintains positive contacting engagements throughout various tolerance ranges of the built up stack. Employing the TIM 150 against the PCBA 20b can also be advantageous where the surface of the PCBA 20b is not entirely free of components such as traces or contacts and the like. In alternative equivalent embodiments the compressibility can be constructed of two individually non-compressible members, such as telescoping members biased away from each other against the PCBA 20b and the internal cover 72, or a spring member, and the like.

Generally, the present embodiments contemplate conducting heat away from the PCBA inside the enclosure so that the heat can be shed by convective heat transfer to the surrounding environment. Various heat conductive paths are described by which heat that is generated by a circuitry package is transferred to the outermost enclosure where the convective transfer is possible. For example, the internal cover 56 conducts heat to the frame 14a that originates from the circuitry package 32. The frame 14a conducts that heat (originating from the circuitry package 32) to the external surfaces of the enclosure; that is, to the external surface of the frame 14a and to the external surfaces of the external covers 16, 18. Forced and free convective air flow over those external surfaces of the enclosure transfers the heat away from the enclosure. The convective heat transfer capability is proportional to the exposed external surface area of the enclosure.

Figure 11:
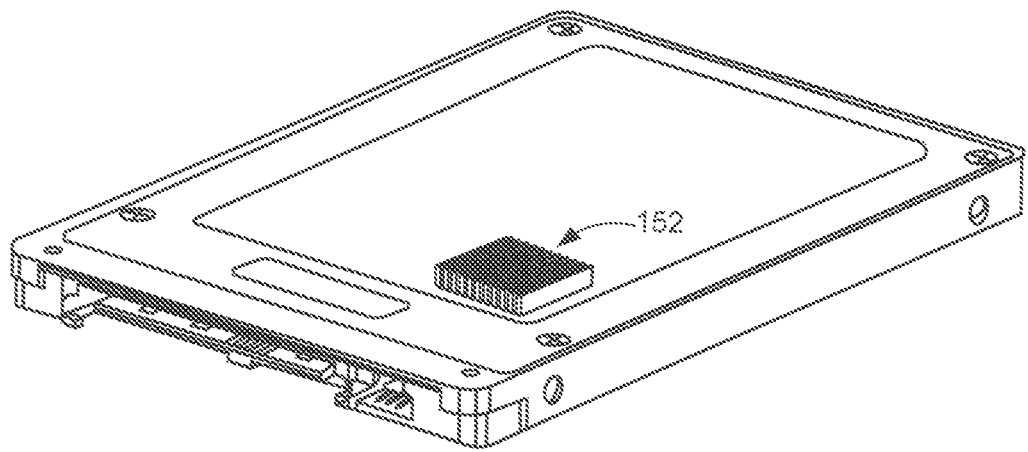
FIG. 11 is an isometric depiction of the data storage assembly of FIG. 1 having an array of fin heat transfer surfaces in the conductive heat transfer path inside the enclosure.

In some embodiments an array of fin surfaces is included in the path of thermal conduction to increase the external surface area of the enclosure, and to thereby enhance the rate at which the heat can be convectively shed to the external environment. FIG. 11 depicts illustrative embodiments in which an array of parallel upstanding fin surfaces 152 are formed as a part of the external cover 16, and thereby disposed in the path of thermal conduction that begins inside the enclosure from the component 32 and ultimately extends to the outer surface of the external cover 16. The illustrative embodiments of FIG. 11 depict a comparatively small portion of the external cover 16 forming the protuberant fin surfaces 152, but the contemplated embodiments are not so limited. In equivalent alternative embodiments the fin surfaces can form a different area up to the entire surface area of one or both external covers as well as from the external surface of the frame.

Figure 12:
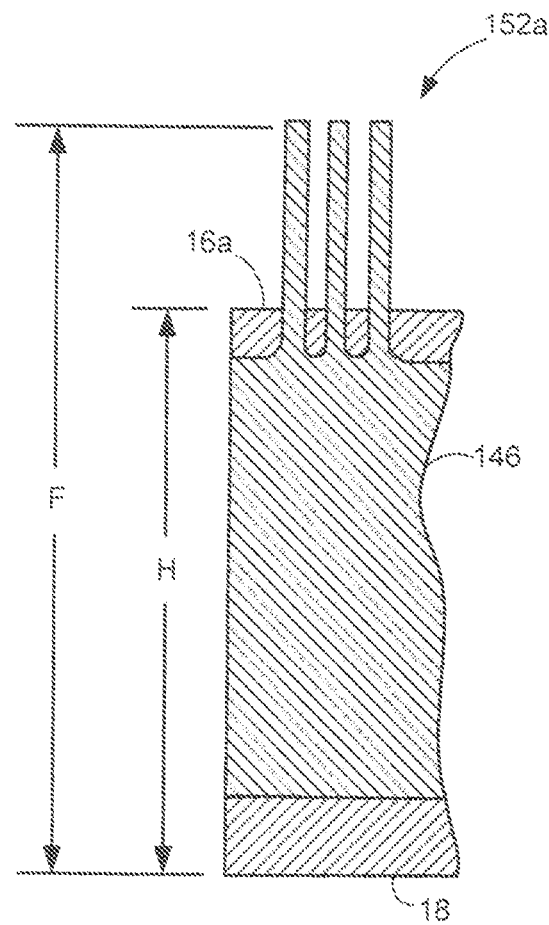
FIG. 12 is a cross-sectional depiction depicting an array of fin heat transfer surfaces extending from the frame and through openings in the external cover.

Furthermore, the fin surfaces 152 are formed as a portion of the external cover 16. FIG. 12 depicts alternate embodiments wherein the fin surfaces 152a are formed as a portion of the frame 14b and extend through appropriately sized openings in the external cover 16a. Again, these depicted embodiments are illustrative and not limiting in that alternatively equivalent embodiments contemplate the fin surfaces 152a extending through one or both external covers and/or along the externally exposed surface of the frame. In yet other equivalent alternative embodiments a heat sink can be attached at a proximal end to a component 32, such as the controller ASIC, and such as with the TIM sandwiched therebetween, with the heat sink extending through an appropriately sized opening in the external cover(s) to provide fin surfaces at the distal end thereof.

FIG. 12 also generally depicts the manner in which the enclosure height ("H") of the solid-state assembly can be effectively increased by the protuberant fin surfaces 152a to provide a standard form factor ("F") of the enclosure/fin combination. For example, without limitation, reductions to practice of these embodiments have converted a single PCBA 2.5 inch by 7-millimeter (H=7 mm) form factor solid-state assembly into a 2.5-inch by 9.5 mm (F=9.5 mm) form factor by the protuberant extension of the fin surfaces 152*a* from the enclosure. Likewise, the 7 mm form factor can be extended to the 12.7 mm or 15 mm form factors by additional protuberant extensions of the fin surfaces 152*a*. In the same manner a dual PCBA 2.5 inch by 12.7 mm form factor solid state assembly can be effectively increased to a 15 mm form factor by the additional protuberant extensions of the fin surfaces 152*a*.

The illustrative embodiments depict elongated parallel fins defining the fin surface arrays, but the contemplated embodiments are not so limited. In alternative embodiments freestanding protuberant posts, such as round or square and the like, can be used to advantageously be exposed to convective airflow in multiple directions as opposed to the single airflow direction accommodated by the valley formed between the adjacent elongated fins depicted.

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, any single or multiple pluralities of the circuit packages and corresponding TIM openings, as well as the heat conductors, and various arrangements thereof are contemplated while still maintaining substantially the same functionality without departing from the scope and spirit of the claimed invention. For example without limitation the contemplated embodiments include standalone TIMs with individual openings as well as the disclosed sheet of TIM with multiple openings. For another example without limitation there can be different numbers of circuit packages and corresponding heat conductors; there can be more than one heat conductor for a circuitry package, or one heat conductor can span more than one circuitry package. Further, although the preferred embodiments described herein are directed to data storage drives, and related technology, it will be appreciated by those skilled in the art that the claimed invention can be applied to other devices employing heat generating components, without departing from the spirit and scope of the present invention.

What is claimed is:

1. An apparatus comprising:
   a frame having a perimeter surface defining a passage;
   a printed circuit board assembly (PCBA) operably disposed within the passage, the PCBA including a printed circuit board and a circuitry package attached to one side of the printed circuit board, the circuitry package having a peripheral edge and a cap, the peripheral edge extending from a proximal end adjacent the printed circuit board to a distal end joined to the cap;
   a cover attached to the frame to enclose the PCBA; and
   a thermal interface material ("TIM") operably disposed between the cover and the PCBA, the TIM defining an opening that is sized to receivingly engage the circuitry package in a close mating engagement operably contacting the TIM simultaneously against the cap and the peripheral edge to conduct heat away from the circuitry package.

2. The apparatus of claim 1 wherein the TIM opening, prior to the TIM contacting the circuitry package, is defined by a TIM surface matching the peripheral edge of the circuitry package that extends substantially orthogonally to the printed circuit board.

3. The apparatus of claim 1 wherein the TIM opening, prior to the TIM contacting the circuitry package, is defined by a TIM surface matching the cap of the circuitry package that is substantially parallel to the printed circuit board.

4. The apparatus of claim 1 comprising a heat conductor attached to the other side of the printed circuit board in an overlapping opposition to the circuitry package to conduct heat away from the printed circuit board that is generated by the circuitry package.

5. The apparatus of claim 1 wherein the PCBA is characterized by a plurality of circuitry packages and the opening is sized for a first circuitry package of the plurality, further comprising the TIM defining a second opening that is sized for the close mating engagement with a second circuitry package of the plurality.

6. The apparatus of claim 1 wherein the opening is molded into the TIM prior to the TIM contacting the circuitry package.

7. The apparatus of claim 1 wherein the circuitry package is characterized as a first circuitry package that is attached to a second circuitry package forming a flip-chip package, the TIM, prior to contacting the flip-chip package, having first surfaces defining the opening that operably contact the cap and the peripheral edge of the first circuitry package and the TIM further having a different second surface that operably contacts the second circuitry package.

8. The apparatus of claim 7 wherein one of the TIM first surfaces that operably contacts the cap is substantially parallel to the second surface.

9. The apparatus of claim 4 wherein the cover is characterized as an external cover, further comprising an internal cover within the passage and enclosing the PCBA, the internal cover contacting the heat conductor and the frame to conduct heat generated by the circuitry package from the heat conductor to the frame.

10. An apparatus comprising:
    a frame having a perimeter surface defining a passage;
    a printed circuit board assembly (PCBA) operably disposed within the passage, the PCBA including a printed circuit board and a circuitry package attached to one side of the printed circuit board;
    a cover operably attached to the frame to enclose the PCBA;
    a thermal interface material ("TIM") operably disposed between the cover and the PCBA to conduct heat away from the circuitry package; and
    a heat conductor attached to the other side of the printed circuit board in an overlapping opposition to the circuitry package to conduct heat away from the printed circuit board that is generated by the circuitry package.

11. The apparatus of claim 10 wherein the cover is characterized as a first cover, comprising a second cover operably attached to the frame to enclose the PCBA.

12. The apparatus of claim 11 wherein the heat conductor is a non-compressible structure operably disposed between the second cover and the PCBA.

13. The apparatus of claim 12 wherein the heat conductor comprises a metal.

14. The apparatus of claim 11 wherein the heat conductor is a compressible structure operably disposed between the second cover and the PCBA.

15. The apparatus of claim 11 wherein the TIM is characterized as a first TIM, the heat conductor comprising a second TIM structure attached to a non-compressible structure.

16. The apparatus of claim 11 wherein the heat conductor defines a plurality of heat transfer fin surfaces.

17. The apparatus of claim 16 wherein the fin surfaces extend from an external surface of the first cover.

18. The apparatus of claim 16 wherein the heat transfer fin surfaces are sized to define a standard form factor of a data storage assembly.

19. The apparatus of claim 10 wherein the first cover is characterized as an external cover, further comprising an internal cover enclosing the PCBA and contacting the heat conductor to conduct heat away from the heat conductor that is generated by the circuitry package.

20. The apparatus of claim 19 further comprising the internal cover contacting the frame to conduct heat to the frame that is generated by the circuitry package.

21. An apparatus comprising:
a frame having a perimeter surface defining a passage;
a printed circuit board assembly (PCBA) operably disposed within the passage, the PCBA including a printed circuit board and a circuitry package attached to one side of the printed circuit board, the circuitry package having a peripheral edge and a cap, the peripheral edge extending from a proximal end adjacent the printed circuit board to a distal end joined to the cap;
a cover operably attached to the frame to enclose the PCBA;
a thermal interface material ("TIM") operably disposed between the cover and the PCBA, the TIM defining an opening that is sized to receivingly engage the circuitry package in a close mating engagement operably contacting the TIM simultaneously against the cap and the peripheral edge to conduct heat away from the circuitry package; and
a heat conductor attached to the other side of the printed circuit board in an overlapping opposition to the circuitry package to conduct heat away from the printed circuit board that is generated by the circuitry package.

22. A method comprising:
obtaining a frame having a perimeter surface defining a passage;
obtaining a printed circuit board assembly (PCBA) having a printed circuit board and a circuitry package attached to one side of the printed circuit board, the circuitry package having a peripheral edge and a cap, the peripheral edge extending from a proximal end adjacent the printed circuit board to a distal end joined to the cap;
obtaining a thermal interface material ("TIM") defining an opening that is sized to receivingly engage the circuitry package in a close mating engagement;
positioning the TIM on the PCBA in the close mating engagement that contacts the TIM simultaneously against the cap and the peripheral edge; and
attaching a cover to the frame to enclose the PCBA.

* * * * *